United States Patent
He et al.

(10) Patent No.: US 8,339,151 B2
(45) Date of Patent: Dec. 25, 2012

(54) HIGH VOLTAGE THYRISTOR VALVE MULTI-INJECTION TEST METHOD

(75) Inventors: Zhiyuan He, Beijing (CN); Guangfu Tang, Beijing (CN); Jialiang Wen, Beijing (CN); Kunpeng Zha, Beijing (CN)

(73) Assignee: China Electric Power Research Institute, Beijing (CN)

( * ) Notice: Subject to any disclaimer, the term of this patent is extended or adjusted under 35 U.S.C. 154(b) by 273 days.

(21) Appl. No.: 12/679,303

(22) PCT Filed: Dec. 18, 2009

(86) PCT No.: PCT/CN2009/001505
§ 371 (c)(1),
(2), (4) Date: Mar. 19, 2010

(87) PCT Pub. No.: WO2011/072431
PCT Pub. Date: Jun. 23, 2011

(65) Prior Publication Data
US 2011/0273201 A1    Nov. 10, 2011

(30) Foreign Application Priority Data
Dec. 14, 2009    (CN) .......................... 2009 1 0242358

(51) Int. Cl.
*G01R 31/26* (2006.01)
(52) U.S. Cl. .......... 324/762.01; 324/762.08; 324/762.09
(58) Field of Classification Search .. 324/762.01–762.1, 324/764.91, 750.01–750.3, 426, 443; 340/512, 340/635; 361/111, 191, 87, 91.8, 93.1, 20
See application file for complete search history.

(56) References Cited

U.S. PATENT DOCUMENTS

| | | | | |
|---|---|---|---|---|
| 4,357,645 A | * | 11/1982 | Lilienthal | 361/93.1 |
| 4,366,532 A | * | 12/1982 | Rosa et al. | 363/69 |
| 5,521,526 A | * | 5/1996 | Nyberg et al. | 324/762.01 |
| 5,528,445 A | * | 6/1996 | Cooke et al. | 361/20 |

* cited by examiner

*Primary Examiner* — Tung X Nguyen

(57) ABSTRACT

This invention provides a high voltage thyristor valve multi-injection test method, it can meet one way valve and double valve operation test and over current test requirements. It has high equivalence and good flexibility. It includes FACTS double way thyristor valve and normal direct current thyristor valve operation tests and over current test. This method is novel, flexible, can carry out many different test and their mixture test and including the high voltage thyristor valve different tests.

2 Claims, 2 Drawing Sheets

HIGH VOLTAGE THYRISTOR VALVE MULTI-INJECTION TEST METHOD

RELATED APPLICATIONS

This Application is a United States National Stage Application filed under 35 U.S.C. §371 of PCT Patent Application Serial No. PCT/CN2009/001505 filed on Dec. 18, 2009, which claims the benefit of Chinese Patent Application Serial No. 200910242358.4 filed on Dec. 14, 2009, the disclosures of all of which are hereby incorporated by reference in their entirety.

FIELD OF THE INVENTION

The present invention belongs to electric power field relates to the current and voltage test method of high voltage thyristor valve, and particularly relates to high voltage thyristor valve operation and over current test method.

BACKGROUND OF THE INVENTION

There are two kinds of high voltage thyristor valve in the present high voltage high power electric application field, one way valve—HVDC valve and the double valve—FACTS valve two kinds. For this two kind thyristors, the test method often adopts synthesis test to carry out thyristor valve operation test and over current test because there are many stress effects under thyristor valve operation and over current conditions, such as voltage, current, voltage variation ratio, current variation ratio, heat and so on.

The present thyristor valve operation test and over current test method is either for the one way valve or for the double way valve only. There is no suitable for both valves. Usually we will have to sacrifice the equivalence and the completeness of one kind voltage thyristor valve test if we want to carry out two kind valve tests at one experiment.

There is no good method either the technology or patent about the multi-injection test method of the high voltage thyristor valve.

The multi-injection method is synthesis of several test method. These three independent methods is high alternating and direct current injection test method, voltage injection test method and resistant voltage test method. There is no effect on other test methods when every test method is used singly, and there is still no effect on other test methods when they are used together. This method realizes the independent and connection with each other under certain conditions function.

SUMMARY OF THE INVENTION

This invention provides a high voltage thyristor valve multi-injection test method, it can meet one way valve and double valve operation test and over current test requirements. It has high equivalence and good flexibility.

This invention provides a high voltage thyristor valve multi-injection test method that a high voltage thyristor valve multi-injection test method includes alternating and direct high current injection test method, voltage injection test and resistant voltage injection test, wherein the alternating and direct current injection circuit, voltage injection double circuit and resistant voltage injection circuit are connected through thyristor valve samples;

Said alternating and direct high current injection test method is that the using the alternating and direct high current circuit produces the high current to providing alternating or direct high injection current for the thyristor valve sample; said voltage injection test method is that using the voltage injection circuit provides the forward high voltage and backward high voltage and different voltage ratio, current ratio for the thyristor valve sample; said resistant voltage injection test method is that using the resistant high voltage circuit provides resistant injection voltage for the thyristor valve sample.

wherein said alternating and direct high current injection test method carries out one way valve and double way valve temperature increasing test by injecting the alternating and direct current to the thyristor valve sample; said voltage injection method and alternating and direct high current test method carry out together the one way valve and double way valve operation tests by injecting the high voltage and high current in the current and voltage interval repeatedly order. Said resistant voltage injection test method and alternating and direct current injection test carry out together the one way valve and double valve over current operation test by injecting the high voltage, high current and reverse high voltage at interval order repeatedly to the thyristor valve sample;

The operation test method is: the alternating and direct current source provides alternating or direct current; conduction angle is controlled by the thyristor valve sample trigging angle. The voltage double injection circuit provides high ratio current impulse for the thyristor valve sample when the high current is on and off on each direction, adjust the wave form of the thyristor valve sample to approaching the actual positive voltage or reverse voltage;

The over current test method is: alternating and direct current source provides alternating or direct current, and heats the thyristor valve sample to test temperature; at the beginning of test, the resistant injection circuit provides positive high voltage to the thyristor valve sample and then the isolating valve of the resistant circuit is shut down, the isolating of the alternating and direct high current circuit is turn on to provide high fault current for the thyristor valve sample, then the isolating also is shut down, the isolating valve of the resistant is again turn on to inject reverse high voltage.

The advantages of the present invention are described as below:

1. This present invention test method can meet one way valve and double way valve operation test requirement, widely applied.

2. This present invention test method can meet one way valve and double way valve over current test requirement, and has well equivalency.

3. This present invention test method is constituted of several methods, different methods can mixture together to realize different test aims.

DETAILED DESCRIPTION OF EMBODIMENTS

Figure 1:
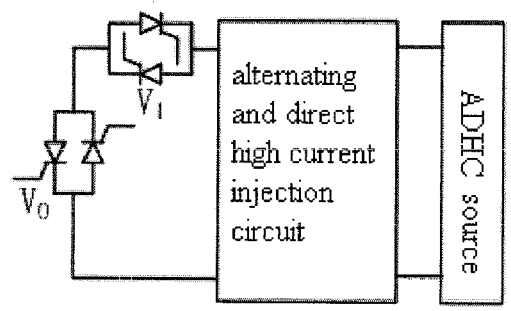
FIG. 1 is schematic diagram of alternating and direct current injection circuit independent action.

As FIG. 1 shown, the alternating and direct high current power source provides power for the alternating and direct high current injection circuit. The power provides high alternating or direct current for thyristor valve sample $V_0$ through the isolating valve $V_1$. It can carry out double way valve and one way valve temperature increasing test. It can also be used as the current source injection circuit of the operation test and the over current test.

Figure 2:
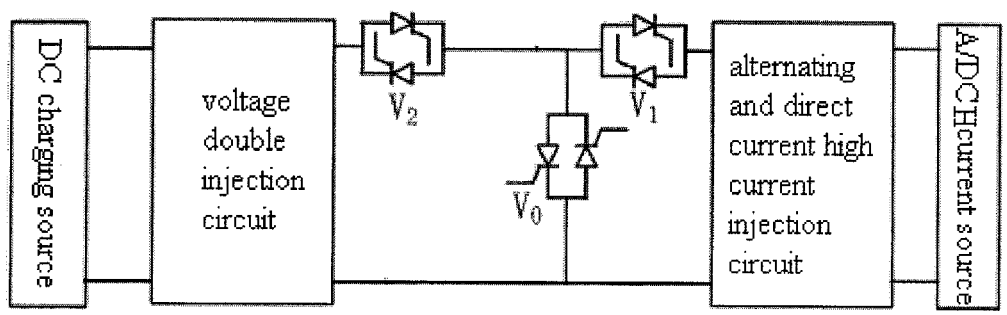
FIG. 2 is schematic diagram of alternating and direct current injection circuit and voltage double circuit action together.

As FIG. 2 shown, the alternating and direct high current power source provides power for the alternating and direct high current injection circuit. The direct charging source provides power for the voltage double injection circuit. Two power sources provide the thyristor valve sample alternating and direct current high current and double injection voltage through isolating $V_1$ and $V_2$. It can be carry out one way valve operation test and double way valve operation test by the isolating valves $V_1$ and $V_2$.

Figure 3:
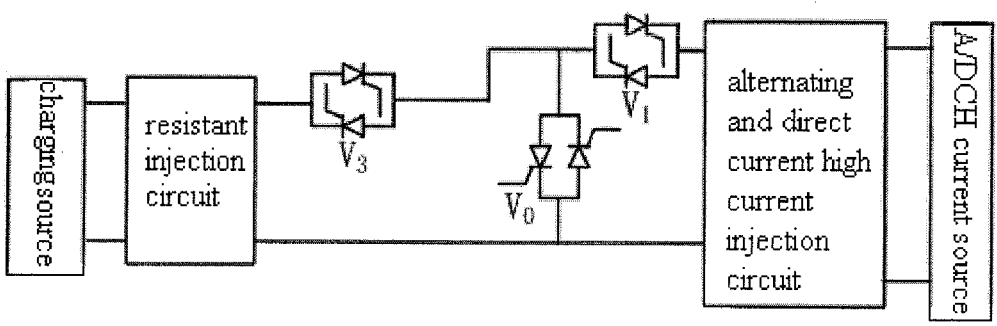
FIG. 3 is schematic diagram of alternating and direct current injection circuit and resistant circuit action together.

As FIG. 3 shown, the alternating and direct high current power source provides power for the alternating and direct high current injection circuit. The charging source provides power for resistant circuit. Two power sources provide the thyristor valve sample alternating and direct current high current and high resistant voltage through isolating $V_1$ and $V_3$. It can be carry out one way valve and double way valve over current half-wave locking tests and unlocking tests by the isolating valves $V_1$ and $V_2$.

Figure 4:
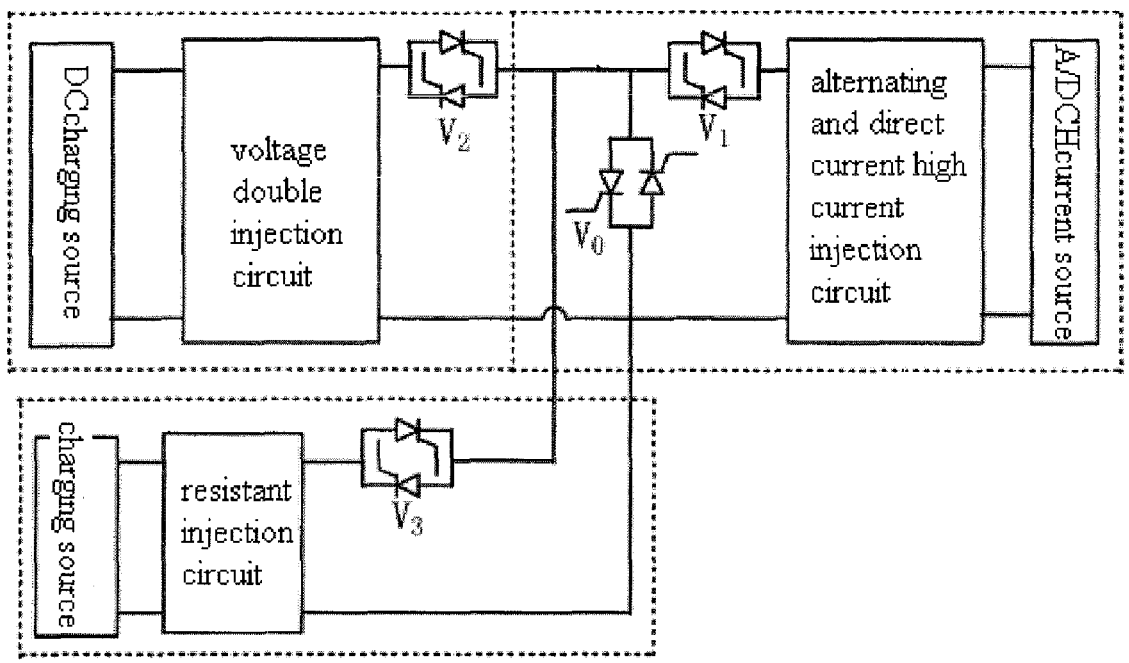
FIG. 4 is multi-injection test circuit schematic diagram of alternating and direct current injection circuit, voltage double circuit and resistant circuit action together.

As FIG. 4 shown, the alternating and direct high current power source provides power for the alternating and direct high current injection circuit. The direct charging source provides power for the voltage double injection circuit. The charging circuit provides power for the resistant injection circuit. Three power sources provide the thyristor valve sample alternating and direct current high current through isolating $V_1$, double injection voltage through isolating $V_2$ and resistant high voltage through $V_3$, respectively. It can be carry out one way valve and double way valve temperature increasing tests, operation test, over current half-wave locking test and unlocking test by isolating valves $V_1$, $V_2$ and $V_3$.

At last, in this description of the embodiments, we have detail describe the present invention according to a particular example. The detail embodiment is one example of the invention but not the only one, so the person in this field must be understand that all the alternatives and other equal and/or similar examples are all within the range of the invention and they are all consistent with the spirits of this invention, are all protected by our claims.

The invention claimed is:

1. A high voltage thyristor valve multi-injection test method comprising:
    an alternating and direct high current injection circuit test method;
    a voltage double injection circuit test method; and
    a resistant injection circuit test method, wherein the alternating and direct high current injection circuit, voltage double injection circuit and resistant injection circuit are connected through thyristor valve samples, wherein,
    said alternating and direct high current injection test method comprises using the alternating and direct high current circuit to produces a high current to provide alternating or direct high injection current for the thyristor valve sample;
    said voltage injection test method comprises using the voltage injection circuit to provide a forward high voltage and backward high voltage and different voltage ratio, and current ratio for the thyristor valve sample; and
    said resistant voltage injection test method comprises using the resistant high voltage circuit to provide resistant injection voltage for the thyristor valve sample.

2. A high voltage thyristor valve multi-injection test method according to claim 1, wherein said alternating and direct high current injection circuit test further comprises:
    a one way valve temperature increasing test, and a double way valve temperature increasing test by injecting the alternating and direct current to the thyristor valve sample;
    said voltage double injection circuit test method and alternating and direct high current circuit test method carry out together a one way valve and double way valve operation tests by injecting the high voltage and high current in the current and voltage at intervals repeatedly, the resistant injection circuit test method and the alternating and direct high current injection circuit test method carry out together a one way valve and double valve over current operation test by injecting the high voltage, high current and reverse high voltage at intervals repeatedly to the thyristor valve sample, wherein,
    the operation test method comprises the alternating and direct current source providing alternating or direct current, wherein the conduction angle is controlled by the thyristor valve sample trigging angle, the voltage double injection circuit provides high ratio current impulse for the thyristor valve sample when the high current is on and off on each direction, and adjust the wave form of the thyristor valve sample to approach the actual positive voltage or reverse voltage; and
    the over current test comprises the alternating and direct current source providing alternating or direct current, and heating the thyristor valve sample to test temperature; wherein, at the beginning of test, the resistant injection circuit provides positive high voltage to the thyristor valve sample and then the isolating valve of the resistant circuit is shut down, isolating of the alternating and direct high current circuit is turned on to provide high fault current for the thyristor valve sample, then the isolating is shut down, and the isolating valve of the resistant is turned on to inject reverse high voltage.

* * * * *